(12) United States Patent
Becker et al.

(10) Patent No.: US 6,222,791 B1
(45) Date of Patent: Apr. 24, 2001

(54) SLEW TOLERANT CLOCK INPUT BUFFER AND A SELF-TIMED MEMORY CORE THEREOF

(75) Inventors: Scott T. Becker, San Jose; Venkata N. Rao, Sunnyvale, both of CA (US)

(73) Assignee: Artisan Components, Inc., Sunnyvale, CA (US)

( * ) Notice: Subject to any disclaimer, the term of this patent is extended or adjusted under 35 U.S.C. 154(b) by 0 days.

(21) Appl. No.: 09/594,977

(22) Filed: Jun. 15, 2000

(51) Int. Cl.$^7$ ........................................ G11C 8/18

(52) U.S. Cl. ..................... 365/233; 365/194; 365/190; 327/212; 327/217

(58) Field of Search ..................... 365/233, 194, 365/190; 327/212, 217, 208, 199

(56) References Cited

U.S. PATENT DOCUMENTS 5,999,482 * 12/1999 Kornachuk et al. .................. 365/233

* cited by examiner

*Primary Examiner*—Andrew Q. Tran
(74) *Attorney, Agent, or Firm*—Martine Penilla & Kim, LLP (57) ABSTRACT

The present invention provides a clock input buffer for a self-timed memory core that is configured to store data. The self-timed memory core generates a reset signal for resetting the clock input buffer. The clock input buffer includes a latch functioning block and a model latch functioning block. The latch functioning block receives a clock signal for generating a control signal for triggering the self-timed memory core to perform an I/O operation. On the other hand, the model latch functioning block receives the clock signal and the control signal for generating a delayed inverse clock signal. The model latch functioning block provides the delayed inverse clock signal to the latch functioning block for generating the control signal. The model latch functioning block is configured to have the same delay and a delay that varies at approximately the same rate as a delay in the latch functioning block.

28 Claims, 6 Drawing Sheets

SLEW TOLERANT CLOCK INPUT BUFFER AND A SELF-TIMED MEMORY CORE THEREOF

BACKGROUND OF THE INVENTION

1. Field of the Invention

The present invention relates generally to integrated circuits, and more particularly to apparatus for improved memory self-timing circuitry.

2. Description of the Related Art

Modem computers typically include one or more memory units for storing data. Among a variety of memory devices, random access memory (RAM) is widely used to allow storage of data and access to the stored data. Conventional RAM units such as DRAM, SRAM, RDRAM, and SDRAM typically include semiconductor memory cores for storing data. These semiconductor memory cores are usually laid-out in array format, such that each individual core cell is coupled by a wordline and a pair of differential bitlines. To access data stored in a selected core cell, associated memory accessing circuitry is commonly designed around a memory core. For example, some of the key memory accessing circuitry typically includes addressing circuitry for selecting a core cell, wordline drivers for driving a selected wordline, and sense amplifiers for amplifying the signal read from the selected core cell. Memory cores and associated memory accessing circuitry are well known in the art and are described, for example, in U.S. patent application Ser. No. 08/956,981, filed Oct. 24, 1999, entitled "High Speed Memory Self-timing Circuitry and Methods for Implementing the Same," now U.S. Pat. No. 5,999,484, which is incorporated herein by reference.

Figure 1A:
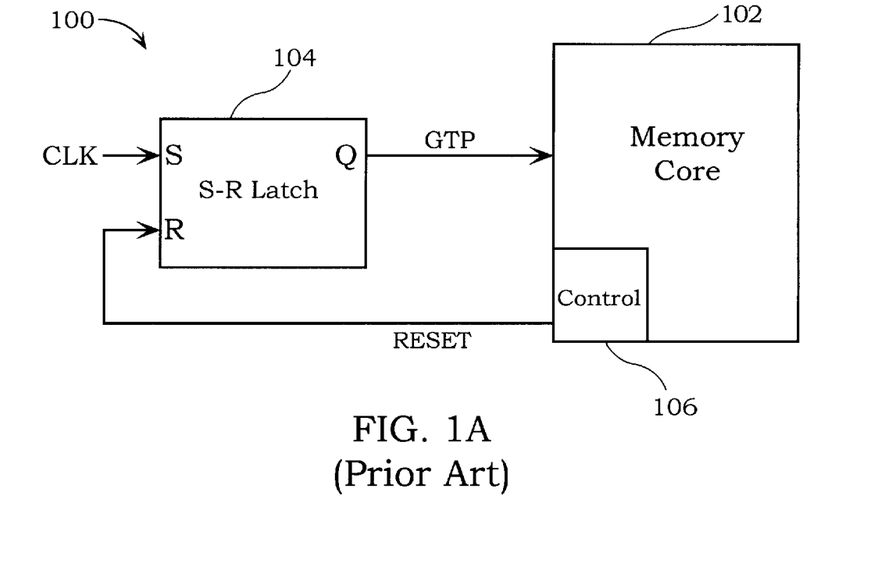
FIG. 1A shows a schematic block diagram of a self-timed memory device having a memory core and an SR latch.

Today's high speed memories are typically self-timed. For example, a memory performs an I/O operation in response to a rising or falling edge of a clock. Upon completion of the operation, the memory generates a reset signal and enters into a reset state (e.g., precharge state) to wait for another I/O operation. FIG. 1A shows a schematic block diagram of a self-timed memory device 100 having a memory core 102 and an SR latch 104. The memory core 102 includes a plurality of core cells (not shown) that are laid out in an array format throughout the memory core 102. The SR latch 104 receives an external clock CLK and a reset signal RESET as inputs. The SR latch 104 generates a global timing pulse (GTP) at its output port. The memory core 102 receives the GTP signal from the clock input buffer 104 for performing an I/O operation such as a read or write operation. Upon completion of the I/O operation, the control circuitry 106 in the memory core 102 generates a RESET signal indicating completion of the I/O operation. The RESET signal is then provided to the SR latch 104 for resetting the latch 104.

Figure 1B:
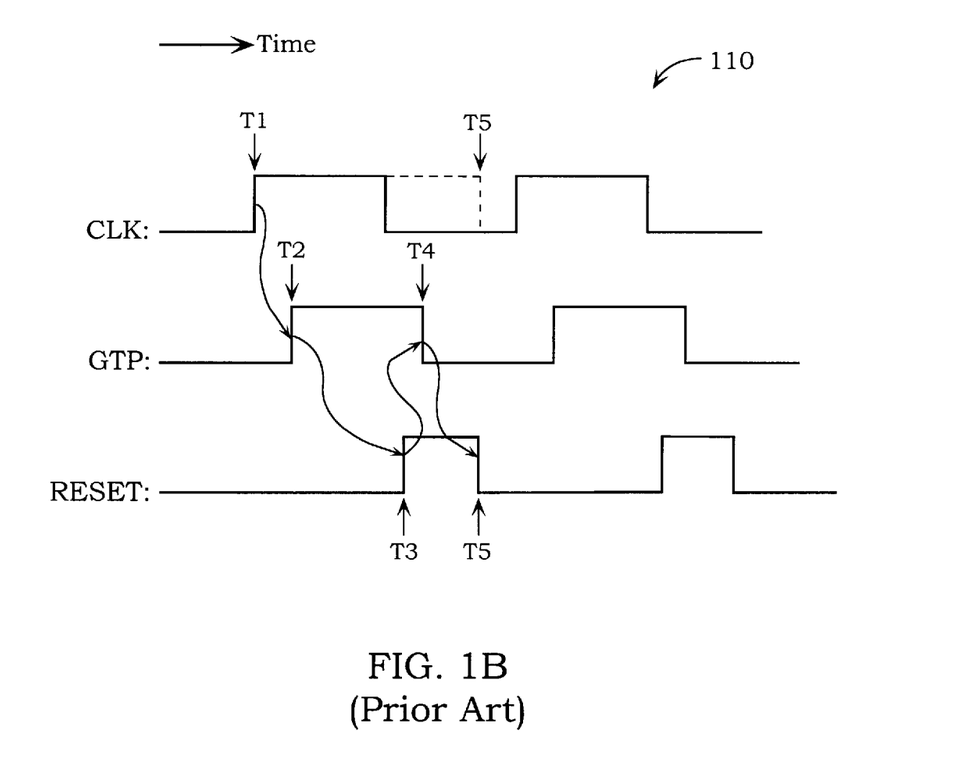
FIG. 1B illustrates a timing diagram of the operation of the self-timed memory device in more detail.

FIG. 1B illustrates a timing diagram 110 of the operation of the self-timed memory device 100 in more detail. In this diagram 110, a rising edge of CLK at time T1 triggers or sets the SR latch 104 to output a high state for GTP at time T2. In response to the GTP, the memory core performs an I/O operation and upon completion, activates RESET high at time T3. The RESET signal then causes the SR latch 104 to reset, which in turn causes GTP signal to go low at time T4. The low GTP signal then causes the memory core 102 to set RESET signal to low at time T5.

Often, however, the CLK may remain in the high state for a longer period of time. For example, as shown in FIG. 1B, the CLK is high from T1 to T5. In this case, the set signal (CLK) and RESET signal are both high, which leads to unstable conditions in the SR latch. Furthermore, when the latch 104 is reset before CLK transitions to low, the memory core 102 may be triggered again when no I/O operation is actually being performed. Hence, the memory core 102 may be triggered multiple times in a single CLK cycle.

Figure 1C:
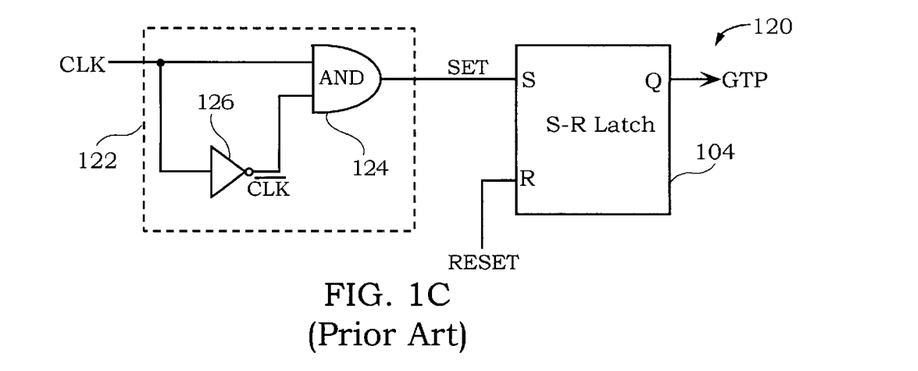
FIG. 1C shows a conventional one-shot coupled to the SR latch at the front end.

To remedy such conditions, conventional self-timed memory devices have implemented one-shot circuits. FIG. 1C shows a conventional one-shot 122 coupled to the SR latch 104 at the front end. The one-shot 122 includes an AND gate 124 and an inverter 126. The AND gate 124 and the inverter 126 both receive CLK as inputs. The inverter 126 inverts CLK and provides inverted $\overline{CLK}$ to the AND gate 124. In this process, the inverter 126 introduces a delay to the inverted signal $\overline{CLK}$. In response to the CLK and delayed $\overline{CLK}$ signals, the AND gate 124 generates a signal SET that is fed into the SR latch 104.

Figure 1D:
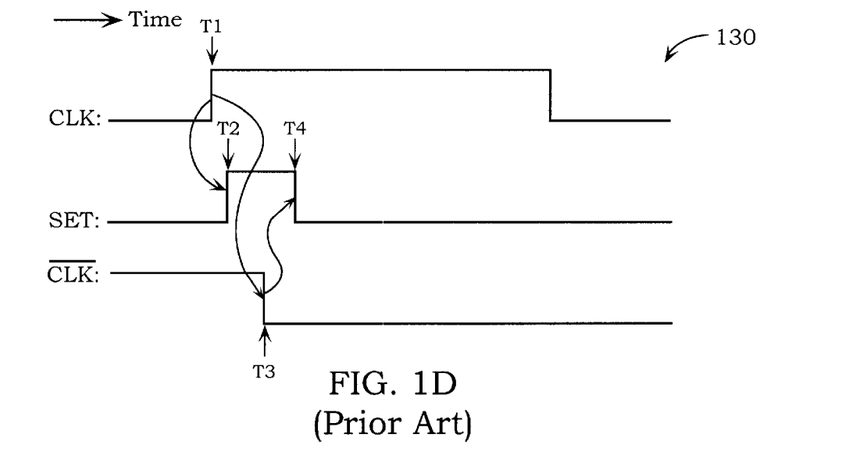
FIG. 1D illustrates a timing diagram of the one-shot in operation.

FIG. 1D illustrates a timing diagram 130 of the one-shot 122 in operation. Initially, when CLK is low, its inverse $\overline{CLK}$ is high in a steady state. Thus, when CLK transitions from low to high at time T1, both CLK and $\overline{CLK}$ are high until time T3. The rising edge of CLK at time T1 causes signal SET to transition from low to high at time T2. In addition, the rising edge of CLK also causes $\overline{CLK}$ to transition from high to low at time T3. The interval between T1 and T3 corresponds to the delay associated with the inverter 126. The transition of $\overline{CLK}$ at T3 causes the SET signal to go low at time T4. By thus triggering SET to transition low, the one-shot 122 prevents multiple triggering the memory core 102 in a single cycle.

The use of one-shot 122, however, has several drawbacks. For example, the one-shot 122 generally requires a sufficiently long delay to set the SR latch 104. This is because the SET must be in high state long enough for the GTP at the output of the SR latch 104 to go high. If the delay associated with the inverter 126 is too short, SET may not be high long enough for the SR latch 104 to output a high state for GTP. In such cases, the SR latch 104 must wait for the SET signal to go high again before triggering the memory core 102. Accordingly, the speed of the memory operations through the memory core 102 may be compromised significantly.

Figure 1E:
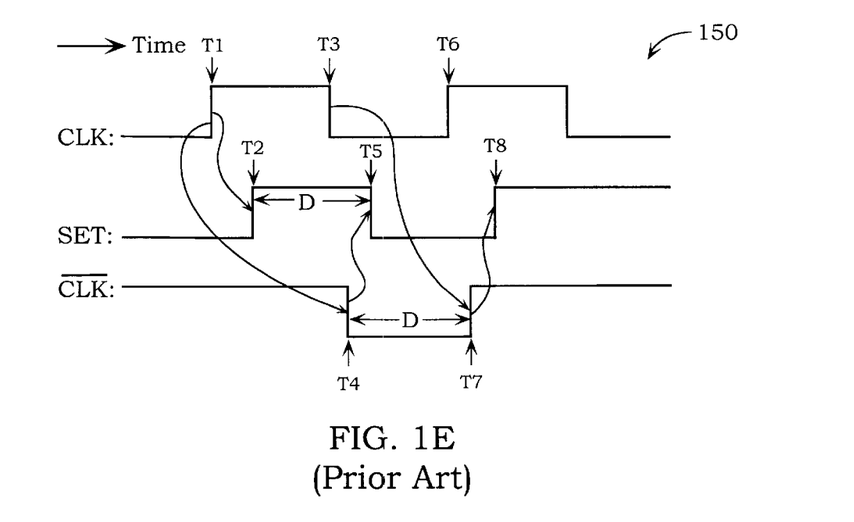
FIG. 1E shows a timing diagram for the one-shot when delay is too long.

On the other hand, if the delay is too long, it can leak into the next cycle. FIG. 1E shows a timing diagram 150 for the one-shot 122 when a delay D is too long. Initially, CLK is low and $\overline{CLK}$ is high at steady state. Then, at time T1, CLK transitions from low to high. This CLK transition causes SET to transition from low to high at time T2. Likewise, the CLK transition at T1 also causes $\overline{CLK}$ to transition from high to low at time T4. The transition of $\overline{CLK}$ at T4 triggers SET to go low at time T5. In the meantime, CLK transitions from high to low at time T3, which triggers $\overline{CLK}$ to go high at time T7. The time interval between T4 and T6 or T2 and T5 corresponds to the delay D.

The transition of $\overline{CLK}$ at T7, in turn, causes SET to go high at time T8. Due to the long delay D, however, $\overline{CLK}$ has not transitioned to a high state before the next rising edge of CLK at time T6. As can be appreciated, such timing irregularity adversely affects the performance of the memory device 100. Furthermore, the slew rate of CLK that is provided to the one-shot may vary over a wide range and may adversely impact the performance of the memory device 100. For example, if the CLK slew rate is too long, one-shot 122 may not be able to trigger SET sufficiently high to trigger the SR latch 104.

Thus, what is needed is a clock input buffer that provides optimum delay to a selftimed memory core to speed up memory access operations without triggering the memory core a multiple times in a cycle. In addition, there is a need for a clock input buffer that can efficiently operate with over a wide range of clock slew rates without compromising memory performance.

SUMMARY OF THE INVENTION

Broadly speaking, the present invention fills these needs by providing a clock input buffer for a self-timed memory core that provides optimum delay for speeding up memory access operations. It should be appreciated that the present invention can be implemented in numerous ways, including as a process, an apparatus, a system, a device, or a method. Several embodiments of the p resent invention are described below.

In one embodiment, the present invention provides a clock input buffer for a self-timed memory core that is configured to store data. The self-timed memory core generates a reset signal for resetting the clock input buffer. The clock input buffer includes a latch functioning block and a model latch functioning block. The latch functioning block receives a clock signal for generating a control signal for triggering the self-timed memory core to perform an I/O operation. On the other hand, the model latch functioning block receives the clock signal and the control signal for generating a delayed inverse clock signal. The model latch functioning block provides the delayed inverse clock signal to the latch functioning block for generating the control signal. The model latch functioning block is configured to have a delay that varies at approximately the same rate as a delay in the latch functioning block.

In another embodiment, a clock input buffer for a self-timed memory core includes a latch functioning block, a delay block, and a first inverter. The self-timed memory core is configured to store data and generates a reset signal for resetting the clock input buffer upon completion of an I/O operation. The latch functioning block receives a clock signal for generating a control signal for triggering the self-timed memory core to perform an I/O operation with the latch functioning block having a first delay in generating the control signal. The delay block receives the clock signal and the control signal for generating a delayed clock signal. The delay block is configured to have a second delay that varies at approximately the same rate as the first delay of the latch functioning block. The first inverter is coupled to the delay block for inverting the delayed clock signal, wherein the first inverter is coupled to provide the inverted delayed clock signal to the latch functioning block for generating the control signal.

In yet another embodiment, a self-timed memory circuit is disclosed. The self-timed memory circuit includes a self-timed memory core and an input clock buffer. The self-timed memory core has an array of core cells for storing data. The self-timed memory core generates a reset signal that indicates a completion of an I/O operation. The input clock buffer is coupled to the self-time memory and is reset in response to the reset signal from the self-timed memory core. The input clock buffer includes a latch functioning block and a model latch functioning block. The latch functioning block receives a clock signal for generating a control signal for triggering the self-timed memory core to perform the I/O operation. The model latch functioning block receives the clock signal and the control signal for generating a delayed inverse clock signal. In addition, the model latch functioning block provides the delayed inverse clock signal to the latch functioning block for generating the control signal. The model latch functioning block is configured to have a second delay that varies at approximately the same rate as a first delay in the latch functioning block.

The matching rate of change in the delay of the latch functioning block and the model latch functioning block ensures an optimum delay in that the delay will neither be too long nor too small. Thus, the memory access operations will be enhanced significantly. In addition, the model latch functioning block is configured to have an input trip point that varies in the same direction at approximately the same rate as the input trip point of the latch functioning block. The matching of the input trip point variance counteracts variance in clock slew rate to further improve the performance of the memory core. Furthermore, the present invention is tolerant to any variety of input slew rates and still provides one-shot capability without sacrificing delay. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

The present invention provides a clock input buffer for a self-timed memory core to provide optimum delay for speeding up memory access operations. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 2:
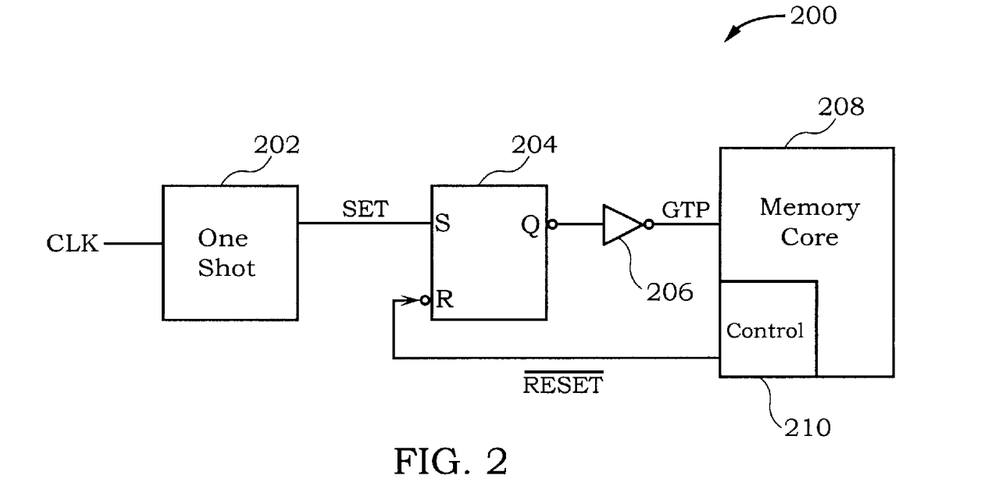
FIG. 2 illustrates an exemplary self-timed memory device in accordance with one embodiment of the present invention.

FIG. 2 illustrates an exemplary self-timed memory device 200 in accordance with one embodiment of the present invention. The memory device 200 includes a one-shot 202, an SR latch 204, an inverter 206, and a memory core 208. The one-shot 202 receives CLK and generates SET signal for triggering the SR latch 204, which is preferably an inverting latch. However, those skilled in the art will recognize that the SR latch 204 may also be implemented as a non-inverting latch as well as other elements (e.g., flip-flops, latches, registers, etc.) that can be set and reset with suitable delay.

Figure 3:
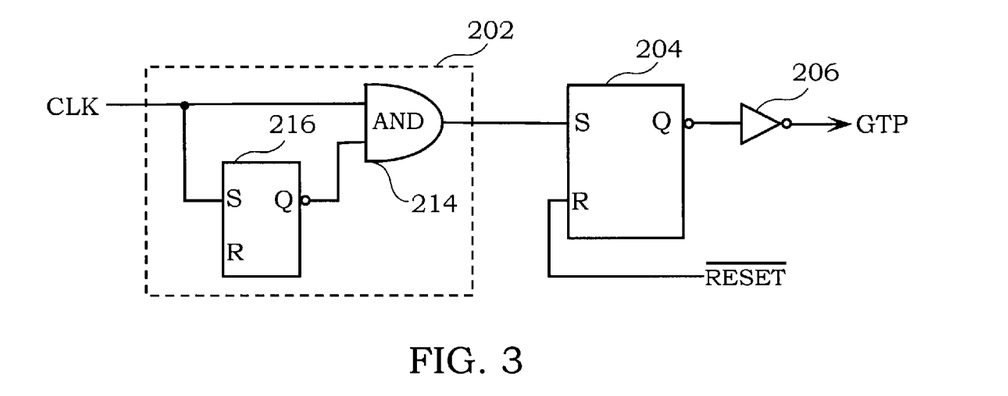
FIG. 3 shows a more detailed block diagram of an one-shot in the self-time memory device in accordance with one embodiment of the present invention.

The SR latch 204 outputs a signal that is fed to the inverter 206. The inverter 206 inverts the signal and provides the inverted signal as global timing pulse (GTP) to the memory core 208. In response to the GTP signal, the memory core 208 performs an I/O operation (read or write operation). Upon completion of the I/O operation, a control circuitry 210 in the memory core 208 generates a reset signal, $\overline{RESET}$, which indicates active low and is provided as a reset signal to the SR latch 204. It should be appreciated however that the reset signal may also be implemented in the memory device 200 as FIG. 3 shows a more detailed block diagram of the one-shot 202 in the self-timed memory device 200 in accordance with one embodiment of the present invention. The one-shot 202 includes an AND gate 214 and a model SR latch 216. The model SR latch 216 models the delay D of the SR latch 204 such that SR latches have approximately the same delay. In addition, the AND gate 214 is preferably built into the SR latches 204 and 216 so that the trip point of the SR latch 216 is same as the trip point of the SR latch 204. As is well known in the art, the term trip point refers to a point at which a device changes its output state in response to an input.

The model SR latch 216 and the AND gate in SR latch 204 receive CLK as inputs. The SR latch 216 outputs $\overline{CLK}$ at its output port, which is then provided to the AND gate 214 as another input. The AND gate performs an AND operation on the received input signals and outputs SET signal to the SR latch 204 for setting the latch 204. As will be described in more detail below, the model SR latch 216 receives CLK and GTP signals to generate an internal reset signal for resetting the latch 216. In this configuration, the matching trip point of the SR latch 216 and the AND gate 214 in conjunction with substantially same delay through both SR latches 204 and 216 ensure that the delay will not be too long to too small.

Figure 4:
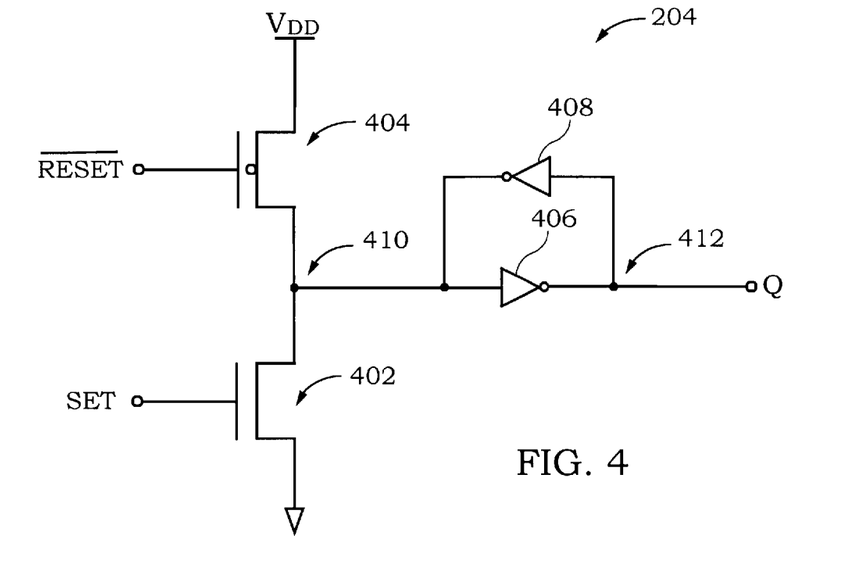
FIG. 4 shows a detailed schematic circuit diagram of an exemplary SR latch.

FIG. 4 shows a detailed schematic circuit diagram of an exemplary SR latch 204. The SR latch 204 includes an N-type transistor 402 (e.g., NMOS), a P-type transistor 404 (e.g., PMOS), and a pair of inverters 406 and 408. The sources of the N- and P-type transistors 402 and 404 are coupled to each other at a node 410 in an inverter configuration. The N-type transistor 402 functions as a pull down transistor while the P-type transistor 404 operates as a pull-up transistor. The inverter 406 is coupled to the output node 410 and inverts the signal at the node 410 for output at output node 412. The inverter 408 is coupled in a feed back mode across the inverter 406 to invert the output signal at node 412 and provides the inverted output to node 410.

In this arrangement, the N-type transistor 402 receives SET signal from the one-shot 202 at its gate while the P-type transistor 404 receives $\overline{RESET}$ at its gate from the control circuitry 210 in the memory core 208. When SET transitions from low to high, the transistor 402 turns on and pulls down the voltage at node 410. In turn, the inverter 406 outputs a high signal at the output node 412. In this manner, the latch 204 is set. On the other hand, when RESET transitions from high to low, the voltage at node 410 transitions high, causing the inverter 406 to output a low state at node 412. Hence, the latch 204 is reset.

Figure 5A:
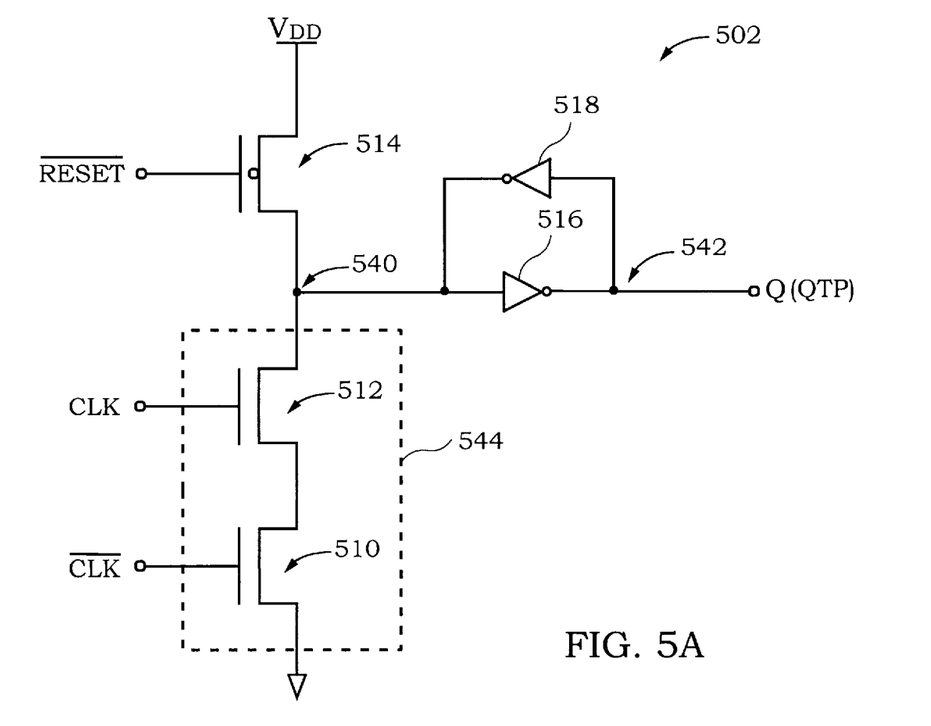
FIG. 5A illustrates a schematic circuit diagram of an exemplary latch functioning block without a delay in accordance with one embodiment of the present invention.

The SR latch 204 may be implemented by combining an SR latch with a NAND gate to form a latch functioning block for use as a clock buffer. For ease of understanding, FIG. 5A illustrates a schematic circuit diagram of an exemplary latch functioning block 502 without a delay in accordance with one embodiment of the present invention. The latch functioning block 500 includes a pair of N-type transistors 510 and 512, a P-type transistor 514, and a pair of inverters 516 and 518. The N-type transistors 510 and 512 are coupled to receive CLK (e.g., SET) and $\overline{CLK}$, and effectively function as a NAND gate 542 to produce an output voltage at node 540. As shown previously in FIG. 4, the transistors 512 and 514 together with the inverters 516 and 518 function as an SR latch to output GTP for triggering the memory core 208. Accordingly, the transistor 512 is shared by the NAND gate 542 and the SR latch in the latch functioning block 502.

Figure 5B:
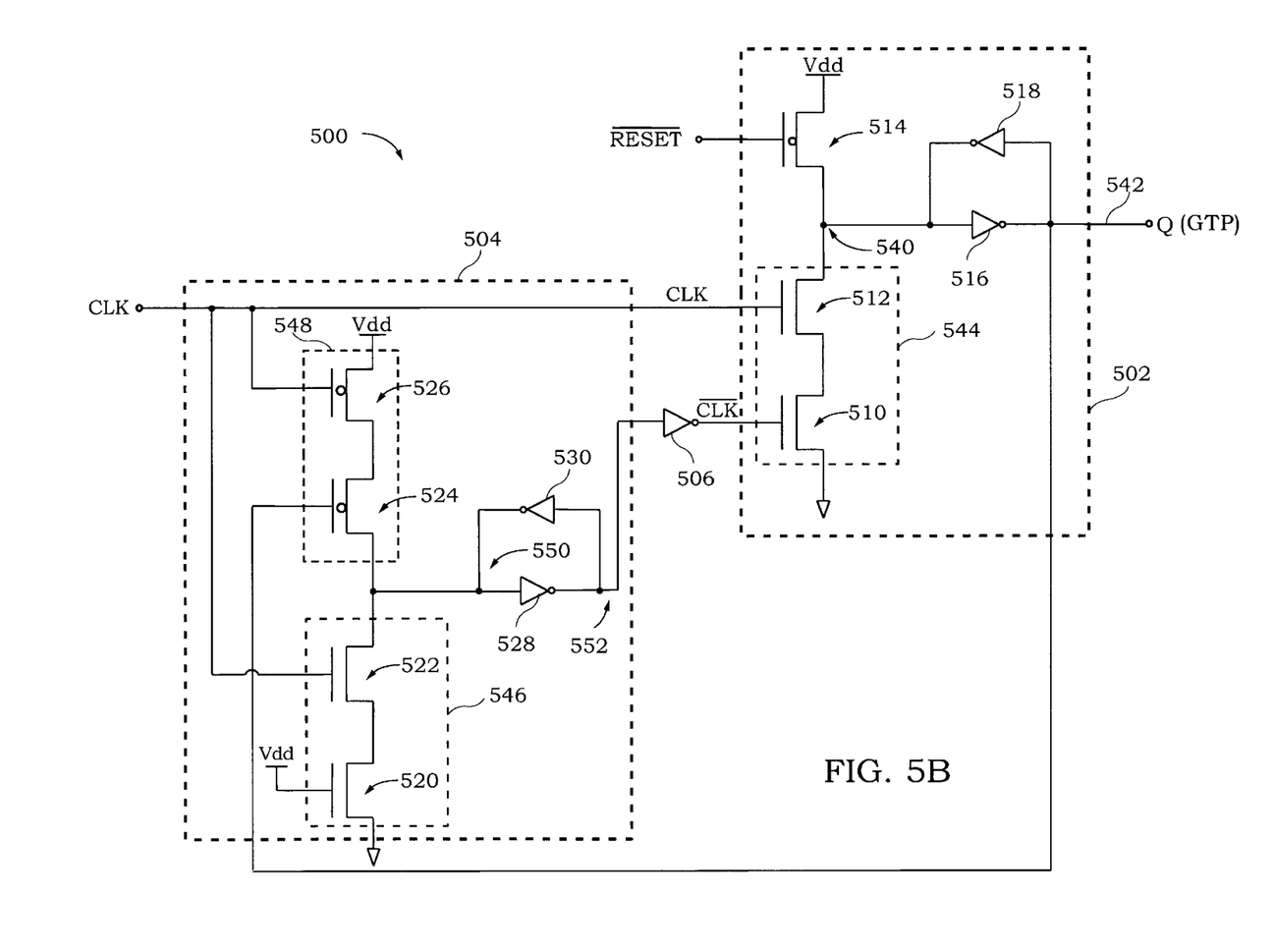
FIG. 5B shows a schematic circuit diagram of an exemplary clock input buffer that includes a model latch functioning block and the latch functioning block in accordance with one embodiment of the present invention.

With reference to FIG. 5B, to avoid triggering the memory core 208 multiple times in an I/O cycle, the latch functioning block 504 effectively prevents GTP from going high when $\overline{RESET}$ is activated low while CLK is high. For example, initially, CLK at the gate of transistor 512 transitions high. If $\overline{CLK}$ at the gate of transistor 510 is high, the transistor 512 pulls the node 540 to low. Hence, GTP at node 542 is high, thereby triggering the memory core 208. When $\overline{CLK}$ at the gate of transistor 510 goes low, the transistor 512 can no longer hold node 540 low. Instead, node 540 is held low by the feedback inverter 518. Node 540 remains low until a reset condition is enabled through a low transition on the input of the transistor 514. The $\overline{CLK}$ signal remains in a low state until CLK makes a low transition in preparation for the next cycle. In so doing, the latch functioning block 500 provides effective one-shot functionality because GTP at node 542 is prevented from being activated multiple times in a single I/O cycle.

With reference to FIG. 5A, it should be noted that the latch functioning block 502 is characterized by a delay D from CLK input gate of transistor 512 to output node 542 where GTP is output. This delay D, from the time CLK is provided to the gate of transistor 512 until the time GTP is generated at node 542, is thus set by the latch functioning block 500. Thus, it takes the delay time D to set the latch in the latch functioning block 502. Accordingly, substantially the same delay D can be used to model a delay for $\overline{CLK}$ so that the delay will be neither too long nor too short. In another embodiment, the modeled transition may be any odd multiple of inversions of the transition in the latch functioning block 502.

FIG. 5B shows a schematic circuit diagram of an exemplary clock input buffer 500 that includes a model latch functioning block 504 and the latch functioning block 502 in accordance with one embodiment of the present invention. The clock input buffer 500 includes the latch functioning block 502, the model latch functioning block 504, and an inverter 506. The latch functioning block 502 includes a pair of N-type transistors 510 and 512, a P-type transistor 514, and a pair of inverters 516 and 518 as described in FIG. 5A and produces GTP at node 542 that prevents triggering the memory core 208 multiple times in a cycle. The output GTP signal is also fed back to the model latch functioning block 504 as an input.

The model latch functioning block 504 includes a NAND gate 546, a NOR gate 526, and a pair of inverters 528 and 530. The NAND gate 546 and the inverters 528 and 530 are arranged in a similar manner as the NAND gate 544 and inverters 516 and 518 in the latch functioning block 502 to provide substantially the same amount of delay. The NAND gate 546 includes a pair of N-type transistors 520 and 522, which receive $V_{DD}$ and CLK at the input gates, respectively.

In one embodiment, the transistors 520 and 522 are modeled to have approximately the same trip point as transistors 510 and 512 in the latch functioning block 502. The trip point matching may be accomplished, for example, by matching parameters such as channel lengths and widths of transistors 520 and 522 with the channel lengths and widths of transistors 510 and 512. Preferably, the trip point of the NAND gate 546 (i.e., transistors 520 and 522) varies in the same direction at approximately the same rate as the NAND gate 544 (i.e., transistors 510 and 512). Such trip point matching counteracts long clock slew problems of conventional clock buffers by ensuring that the transistors 520 and 522 trip approximately at or after the transistors 510 and 512.

With continuing reference to FIG. 5B, the NAND structure 546 is coupled to the NOR structure 548 at node 550. The NOR structure 548 includes a pair of P-type transistors 524 and 526, which receive GTP and CLK signals at the input gates, respectively. The NOR structure 548 generates a reset signal in response to the input GTP and CLK signals for resetting the model latch functioning block 504. For example, when both CLK and GTP are low, the NOR structure 548 outputs a high output voltage node 550. Otherwise, if CLK is high, there is a low at node 550. If CLK is low and GTP is high, the value at node 550 is "kept" by the latch inverters 528 and 530.

The modeled latch functioning block 504 ensures that $\overline{CLK}$ a delay that is optimized and matched to the delay in the latch functioning block 502. The inverter 528 is coupled to the output node 550 to invert the signal at node 550 for output at output node 552. The inverter 530 is coupled in a feed back mode across the inverter 528 to invert the output signal at node 552 and provides the inverted output to node 550. The inverters 528 and 530 are configured to provide substantially the same delay as the inverters 516 and 518 in the latch functioning block 502.

In addition, the NAND structure 546 is are also configured to provide substantially the same delay as the NAND structure 544 in the latch functioning block. Hence, the delay through the model latch functioning block 504 is approximately the same (e.g., two gate delays) as the delay through the latch functioning block 502. In a preferred embodiment, the delay through the model latch functioning block 504 varies at approximately the same rate as the delay through the latch functioning block 502. Those skilled in the art will recognize that the model latch functioning block 504 may also provide any transistion that is an even number of inversions of the transistion in the latch functioning block.

The inverter 506 is coupled, between the model latch functioning block 504 and latch functioning block 502 for providing an inverted clock $\overline{CLK}$. Specifically, the inverter 506 inverts the output signal at node 552 to produce $\overline{CLK}$. The $\overline{CLK}$ from the inverter 506 is then provided as an input to the transistor 510 of the NAND structure 544 in the latch functioning block. By thus matching rate of change in the delay of the latch functioning block and the delay block ensures an optimum delay that substantially speeds up memory access operations. In addition, the matching of the trip point variance counteracts variance in clock slew rate to further improve the performance of the memory core.

Figure 6:
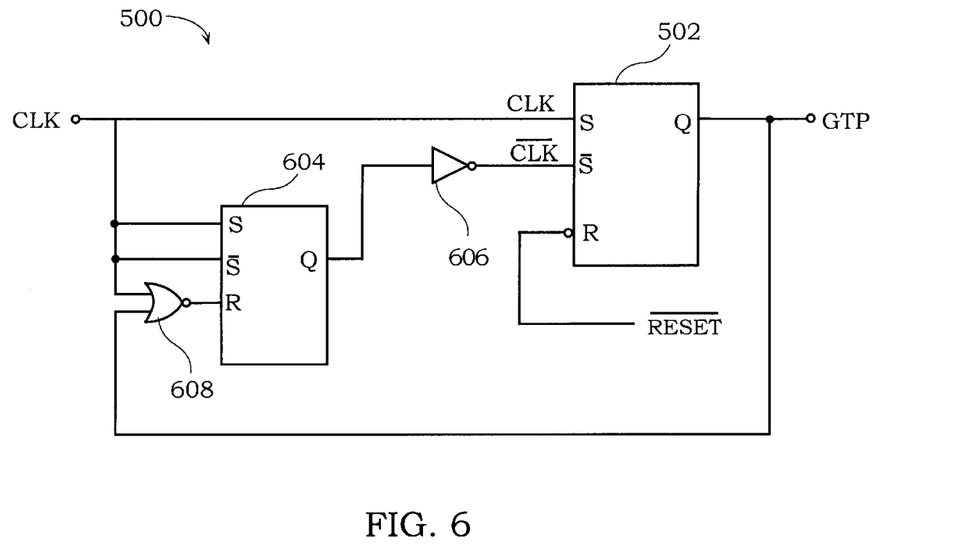
FIG. 6 illustrates a simplified schematic diagram of a clock input buffer 500 in accordance with one embodiment of the present invention.

FIG. 6 illustrates a simplified schematic diagram of a clock input buffer 500 in accordance with one embodiment of the present invention. As shown, the clock input buffer 500 includes latch functioning block 502, a model delay block 604, an inverter 606, and a NOR gate 608. The latch functioning block 502 receives CLK, $\overline{CLK}$, and $\overline{RESET}$ as inputs. The model delay block 604 and NOR gate 608 corresponds to the model latch functioning block 504 of FIG. 5B. The NOR gate receives CLK and GTP and provides NOR result to the delay block 604 for resetting the delay block 604. The model delay block 604 receives CLK and the reset signal and generates an output signal. The inverter 606 inverts the output signal from the delay block 604 to produce $\overline{CLK}$, which is then provided to the latch functioning block 502.

Figure 7:
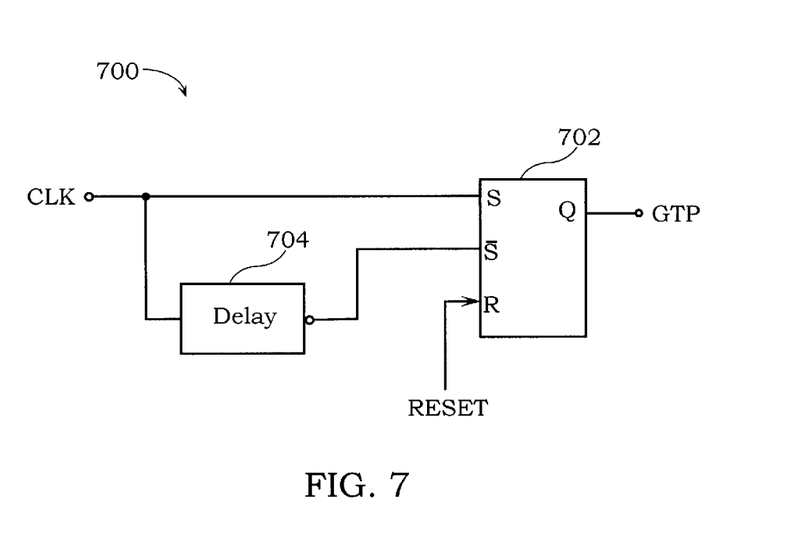
FIG. 7 shows a high level schematic diagram of a clock input buffer 700 with delay in accordance with one embodiment of the present invention.

FIG. 7 shows a high level schematic diagram of a clock input buffer 700 with delay in accordance with one embodiment of the present invention. The clock input buffer 700 includes an SR latch functioning block 702 and a delay block 704. The delay block generates a delay, which is provided to the SR latch functioning block 702 along with CLK. The RESET from the memory core 208 is also provided to the SR latch functioning block 702.

Although the foregoing invention has been described in some detail for purposes of clarity of understanding, it will be apparent that certain changes and modifications may be practiced within the scope of the appended claims. It should therefore be understood that the various circuit diagrams may be embodied in any form which may include, for example, any suitable semiconductor substrate, printed circuit board, packaged integrated circuit, or software implementation.

By way of example, hardware description language (HDL) design and synthesis programs, such as, VHDL® hardware description language available from IEEE of New York, N.Y. may be implemented to design the silicon-level layouts. Accordingly, the present embodiments are to be considered as illustrative and not restrictive, and the invention is not to be limited to the details given herein, but may be modified within the scope and equivalents of the appended claims.

What is claimed is:

1. A clock input buffer for a self-timed memory core that is configured to store data, the self-timed memory core generating a reset signal for resetting the clock input buffer, the clock input buffer comprising:

a latch functioning block receiving a clock signal for generating a control signal for triggering the self-timed memory core to perform an I/O operation; and a model latch functioning block receiving the clock signal and the control signal for generating a delayed inverse clock signal, the model latch functioning block providing the delayed inverse clock signal to the latch functioning block for generating the control signal, wherein the model latch functioning block is configured to have a delay that varies at approximately the same rate as a delay in the latch functioning block.

2. The clock input buffer as recited in claim 1, wherein the latch functioning block is configured to have a trip point for producing the control signal, wherein the model latch functioning block is configured to have the same trip point that varies in the same direction at approximately the same rate as the trip point of the latch functioning block.

3. The clock input buffer as recited in claim 2, wherein the latch functioning block includes a NAND structure and a latch, wherein the NAND structure defines the trip point for the latch functioning block.

4. The clock input buffer as recited in claim 3, wherein the model latch functioning block includes a NAND structure that is configured to have the same trip point that varies in the same direction at approximately the same rate as the trip point of NAND structure in the latch functioning block.

5. The clock input buffer as recited in claim 1, further comprising:
an inverter coupled between the model latch functioning block and the latch functioning block, the inverter inverting a delayed output signal from the model latch functioning block and generating the delayed inverted clock signal that is provided to the latch functioning block.

6. The clock input buffer as recited in claim 1, wherein the delay in the model latch functioning block is approximately matched to the delay in the latch functioning block.

7. The clock input buffer as recited in claim 1, wherein the model latch functioning block includes a NOR structure that receives the clock signal and the control signal for resetting the model latch functioning block.

8. The clock input buffer as recited in claim 3, wherein the latch is an SR latch.

9. The clock input buffer as recited in claim 1, wherein the clock input buffer is tolerant to any variety of input slew rates and still provides one shot capability.

10. A clock input buffer for a self-timed memory core, the self-timed memory core being configured to store data and generating a reset signal for resetting the clock input buffer upon completion of an I/O operation, the clock input buffer comprising:
a latch functioning block receiving a clock signal for generating a control signal for triggering the self-timed memory core to perform the I/O operation, the latch functioning block having a first delay in generating the control signal;
a delay block receiving the clock signal and the control signal for generating a delayed clock signal, wherein the delay block is configured to have a second delay that varies at approximately the same rate as the first delay of the latch functioning block; and
a first inverter coupled to the delay block for inverting the delayed clock signal, wherein the first inverter is coupled to provide the inverted delayed clock signal to the latch functioning block for generating the control signal.

11. The clock input buffer as recited in claim 10, wherein the second delay is an odd number of inversions of the first delay.

12. The clock input buffer as recited in claim 10, wherein the latch functioning block is configured to have a trip point for producing the control signal, wherein the delay block is configured to have the same trip point that varies in the same direction at approximately the same rate as the trip point of the latch functioning block.

13. The clock input buffer as recited in claim 12, wherein the latch functioning block includes a first NAND structure and a latch, wherein the NAND structure defines the trip point for the latch functioning block.

14. The clock input buffer as recited in claim 13, wherein the delay block includes a second NAND structure that is configured to have the same trip point that varies in the same direction at approximately the same rate as the trip point of the first NAND structure in the latch functioning block.

15. The clock input buffer as recited in claim 10, wherein the second delay of the delay block is approximately matched to the first delay of the latch functioning block.

16. The clock input buffer as recited in claim 10, further comprising:
a NOR structure receiving the clock signal and the control signal for resetting the delay block.

17. The clock input buffer as recited in claim 14, wherein the delay block includes a second inverter and the latch functioning block includes a third inverter, wherein the first delay is defined by the first NAND structure and the third inverter, and wherein the second delay is defined by the second NAND structure and the second inverter.

18. The clock input buffer as recited in claim 13, wherein the latch is an SR latch.

19. The clock input buffer as recited in claim 10, wherein the clock input buffer is tolerant to any variety of input slew rates and still provides one-shot capability.

20. A memory circuit comprising:
a self-timed memory core having an array of core cells for storing data, the self-timed memory core generating a reset signal that indicates a completion of an I/O operation; and
an input clock buffer coupled to the self-time memory core, the input clock buffer being reset in response to the reset signal from the self-timed memory core, the input clock buffer including:
a latch functioning block receiving a clock signal for generating a control signal for triggering the self-timed memory core to perform the I/O operation; and
a model latch functioning block receiving the clock signal and the control signal for generating a delayed inverse clock signal, the model latch functioning block providing the delayed inverse clock signal to the latch functioning block for generating the control signal, wherein the model latch functioning block is configured to have a second delay that approximately matches the first delay and varies at approximately the same rate as a first delay in the latch functioning block.

21. The memory circuit as recited in claim 20, wherein the latch functioning block is configured to have a trip point for producing the control signal, wherein the model latch functioning block is configured to have the same trip point that varies in the same direction at approximately the same rate as the trip point of the latch functioning block.

22. The memory circuit as recited in claim 21, wherein the latch functioning block includes a first NAND structure and a latch, wherein the NAND structure defines the trip point for the latch functioning block.

23. The memory circuit as recited in claim 22, wherein the model latch functioning block includes a second NAND structure that is configured to have the same trip point that varies in the same direction at approximately the same rate as the trip point of the NAND structure in the latch functioning block.

24. The memory circuit as recited in claim 23, further comprising:
a first inverter coupled between the model latch functioning block and the latch functioning block, the first inverter inverting a delayed output signal from the model latch functioning block and generating the delayed inverted clock signal that is provided to the latch functioning block.

25. The memory circuit as recited in claim 21, wherein the second delay in the model latch functioning block is approximately matched to the first delay in the latch functioning block.

26. The memory circuit as recited in claim 21, wherein the model latch functioning block includes a NOR structure that receives the clock signal and the control signal for resetting the model latch functioning block.

27. The memory circuit as recited in claim 24, wherein the model latch functioning block includes a second inverter and the latch functioning block includes a third inverter, wherein the first delay is defined by the first NAND structure and the third inverter, and wherein the second delay is defined by the second NAND structure and the second inverter.

28. The memory circuit as recited in claim 20, wherein the clock input buffer is tolerant to any variety of input slew rates and still provides one-shot capability.

* * * * *